(12) United States Patent
Tu et al.

(10) Patent No.: US 7,626,449 B2
(45) Date of Patent: *Dec. 1, 2009

(54) APPARATUS AND METHOD FOR TUNING CENTER FREQUENCY OF A FILTER

(75) Inventors: Wei-Hsuan Tu, Hsinchu (TW); Tse-Hsiang Hsu, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/139,522

(22) Filed: Jun. 16, 2008

(65) Prior Publication Data

US 2008/0252365 A1 Oct. 16, 2008

Related U.S. Application Data

(63) Continuation of application No. 11/554,035, filed on Oct. 30, 2006, now Pat. No. 7,403,063.

(60) Provisional application No. 60/597,333, filed on Nov. 23, 2005.

(51) Int. Cl.
G06G 7/12 (2006.01)
H01L 31/00 (2006.01)
H03B 5/04 (2006.01)
H03F 3/45 (2006.01)
H03L 1/02 (2006.01)
H03L 7/06 (2006.01)
H04B 1/10 (2006.01)

(52) U.S. Cl. ........................ 327/552; 327/103; 327/513; 327/553; 327/562; 327/563; 330/253; 330/254; 330/289; 331/17; 331/59

(58) Field of Classification Search ................. 327/103, 327/156–159, 513, 551–553, 561–563; 330/253, 330/254, 278, 279, 289; 331/10, 11, 14, 331/17, 18, 25, 59, DIG. 2
See application file for complete search history.

(56) References Cited

U.S. PATENT DOCUMENTS

| | | | |
|---|---|---|---|
| 6,737,919 B2 | 5/2004 | Cyrusian | |
| 6,914,489 B2 | 7/2005 | Charlon | |
| 7,403,063 B2 * | 7/2008 | Tu et al. | 327/552 |

* cited by examiner

*Primary Examiner*—David Mis
(74) *Attorney, Agent, or Firm*—Winston Hsu

(57) ABSTRACT

A method for tuning a filter is provided. The method includes: enabling a VCO circuit, wherein at least a portion of the VCO circuit is selected from the filter; generating an oscillation signal by the VCO circuit according to a driving signal; comparing the oscillation signal with a reference signal and generating a comparison result; and adjusting the driving signal according to the comparison result.

14 Claims, 10 Drawing Sheets

APPARATUS AND METHOD FOR TUNING CENTER FREQUENCY OF A FILTER

CROSS REFERENCE TO RELATED APPLICATIONS

This continuation application claims the benefit of U.S. patent application Ser. No. 11/554,035 (filed on Oct. 30, 2006) and U.S. provisional application No. 60/597,333 (filed on Nov. 23, 2005), which are included herein by reference.

BACKGROUND

The invention relates to a tuning apparatus and method, and more particularly, to an apparatus for tuning a center frequency of a filter and related method thereof.

Filters have been widely used in many applications. In general, the implementations of the filters can be roughly divided into two types of structures, which are discrete-time switch-capacitor filters and continuous-time filters (including gm-C filter, MOSFET-C filter, etc.). Because of the limitation of clock frequency, a high-frequency filter is often implemented by the continuous-time structure. Furthermore, in different types of continuous-time filters, the gm-C filter is the most general.

However, the variation degree of some characteristics, such as cut-off frequency (center frequency), of the continuous-time filter is often larger than 30% due to the influences of variations in the manufacturing process and temperature variations. Therefore, a tuning mechanism should be added into the filter to overcome the process and temperature variations such that the frequency response of the filter is not affected by the influences of the process and temperature variations.

In the gm-C filter structure, the cut-off frequency (center frequency) can be represented by the following equation $w_c = K * g_{m,u}/C$, where $g_{m,u}$ represents a gm (trans-conductance) value of a trans-conductor per unit, C represents a total capacitance value corresponding to a node, and K is a scaling factor larger than 0. From the above equation, it can be seen that when the center frequency $w_c$ deviates from a target value, the gm value $g_{m,u}$ or the capacitance value C can be adjusted to tune the center frequency $w_c$ back to the target value. In order to achieve the purpose of tuning the center frequency $w_c$, either the gm value $g_{m,u}$ or the capacitance value C can be adjusted. Please note that adjusting the gm value $g_{m,u}$ or the capacitance value C is equivalent. The spirit of the two adjusting methods is the same.

Taking the method of adjusting the gm value $g_{m,u}$ as an example, please refer to FIG. 1, which shows a conventional tuning structure 100 of adjusting the gm value $g_{m,u}$ of a main filter 110. Please note, the main filter 110 is a target filter to be tuned. Furthermore, in FIG. 1, the tuning operation is performed by a PLL (including FD 120 the charge pump 121 and the loop filter 122) cooperating with a VCO 130. Please note, under the tuning structure 110 shown in FIG. 1, the VCO 130 is better composed of the same trans-conductor cells as those of the main filter 110, the VCO 130 has the same environment (e.g., loading, etc.) as the main filter 110, and the gm value of the trans-conductor circuits of the VCO 130 and the main filter 110 are controlled by the same control signal Vc. Therefore, if the tracking relationship between the VCO 130 and the main filter 110 is better, the tuning operation of the tuning structure can be more accurate. In other words, when the VCO 130 is tuned, the main filter 110 is also tuned because they have similar environment. Assume that the center frequency $w_c$ of the main filter 110 is ideally equal to the $K * g_{m,u}/C$, and the oscillation frequency $w_o$ of the VCO 130 is equal to $N * g_{m,u}/C$. When the PD 120 of the PLL is locked to a certain frequency, the control signal Vc is adjusted to change the gm value $g_{m,u}$ such that the $f_o = (1/2\pi) (N * g_{m,u}/C) = f_{ref}$. As mentioned previously, the main filter 110 and the VCO 130 has a good tracking relationship (e.g., they have the same gm value $g_{m,u}$). Therefore, $f_c = (1/2\pi) (K * g_{m,u}/C) = (K/N) f_o = (K/N) f_{ref}$. Obviously, if the values K, N, and $f_{ref}$ can be selected properly, the center frequency of the main filter 110 can be tuned to a target frequency.

Please refer to FIG. 2, which is a diagram of another conventional tuning structure 200. Please note, the tuning structure 200 shown in FIG. 2 utilizes a similar concept. The tuning structure 200 utilizes similar trans-conductor cells to form the master filter 230 (in general, the master filter shown in FIG. 2 has lower levels), and utilizes the characteristic of the master filter 230 to perform the tuning tasks. For example, a two-level Biquad LPF has a 90 degree phase delay at the point where $w_o = N * g_{m,u}/C$. Therefore, when the signal having the frequency $f_{ref}$ is inputted into the master filter 230, the entire tuning structure 200 utilizes the phase detector (PD) 220 to determine whether the phase difference is 90 degrees. Additionally, recall as mentioned previously, the feedback mechanism is implemented by a PLL including a charge pump 221 and a loop filter 222, the negative feedback mechanism adjusts the control signal Vc to make the $f_o = (1/2\pi) (N * g_{m,u}/C) = f_{ref}$. From the above-mentioned structure, it can be easily seen that $f_c = (1/2\pi) (K * g_{m,u}/C) = (K/N) f_o = (K/N) f_{ref}$. Therefore, the tuning structure 200 shown in FIG. 2 can also achieve the same tuning goal.

The above-mentioned structures both needs a PLL including a PD, a charge pump, and a loop filter. It is known that the PLL occupies a larger area and as one result, this increases the cost. Please refer to FIG. 3, which is a diagram of another conventional tuning mechanism 300. The tuning mechanism 300 utilizes a digital circuit 320 to perform a negative feedback control. The entire tuning method shown in FIG. 3 is more similar to the tuning structure shown in FIG. 1. The difference between the tuning structures shown in FIG. 3 and FIG. 1 is that the tuning structure shown in FIG. 3 utilizes a digital circuit 320 (i.e., a digital FD) to compare the frequency $f_{ref}$ with the frequency $f_c$ generated by the VCO 330 instead of utilizing a PLL. Thereby, the comparison result is transformed into a control signal through a DAC 340 in order to adjust the frequency $f_c$. Similarly, because of the tracking relationship between the VCO 330 and the main filter, when the oscillation signal of the VCO 330 is tuned, the cut-off frequency of the main filter 310 can be tuned successfully.

The influences caused by the process and temperature variations upon the frequency $f_c$, can be alleviated through the above-mentioned tuning mechanisms. Obviously, the above-mentioned tuning mechanisms need either a VCO or a master filter. Furthermore, either the VCO or the master filter is often a two-level system. In addition, in order to make the environment similar to the main filter, all dummy devices, dummy loading, and other circuits, which have originally been set up in the main filter, also have to be copied and implemented inside the tuning structure (e.g., the above-mentioned VCO or master filter) to make the environment similar. In most of the applications, the tuning structure often occupies a huge area larger than 20% of the entire circuit. Therefore, the above-mentioned tuning mechanism consumes a large area and high cost resulting in an uneconomical solution.

SUMMARY OF THE INVENTION

It is therefore one of the objectives of the claimed disclosure to provide an apparatus for tuning a center frequency of a filter and related method thereof, to solve the above-mentioned problem.

According to one exemplary embodiment of the claimed disclosure, a method for tuning a filter is provided. The method includes: enabling a VCO circuit, wherein at least a portion of the VCO circuit is selected from the filter; generating an oscillation signal by the VCO circuit according to a driving signal; comparing the oscillation signal with a reference signal and generating a comparison result; and adjusting the driving signal according to the comparison result.

According to another exemplary embodiment of the claimed disclosure, a filter is provided. The filter includes: a first portion; a second portion; and an enabling circuit to incorporate the second portion into a VCO circuit in a tuning mode. The first portion and the second portion perform a filtering operation in a normal mode.

According to yet another exemplary embodiment of the claimed disclosure, a tuning apparatus for tuning a filter is provided. The tuning apparatus includes an enabling circuit, a frequency detector, and a controlling circuit. The enabling circuit is for switching the filter between a normal mode and a tuning mode, wherein in the tuning mode, a portion of the filter is configured to be a VCO for generating an oscillation signal according to a driving signal, and in the normal mode, the filter performs a filtering operation. The frequency detector is for comparing the oscillation signal with a reference signal and generating a comparison result. The controlling circuit is for adjusting the driving signal according to the comparison result.

These and other objectives of the present invention will no doubt become obvious to those of ordinary skill in the art after reading the following detailed description of the preferred embodiment that is illustrated in the various figures and drawings.

DETAILED DESCRIPTION

In the following filter frequency tuning device and related method thereof, the tuning procedure is basically divided into two steps. The first step is to use a VCO inside a main filter to adjust the cut-off frequency of the main filter in order to remove the influence of the process variation of the center frequency $f_c$. The second step is to utilize a gm replica circuit on-line control to remove the influence of the temperature variation of the center frequency $f_c$.

Figure 4:
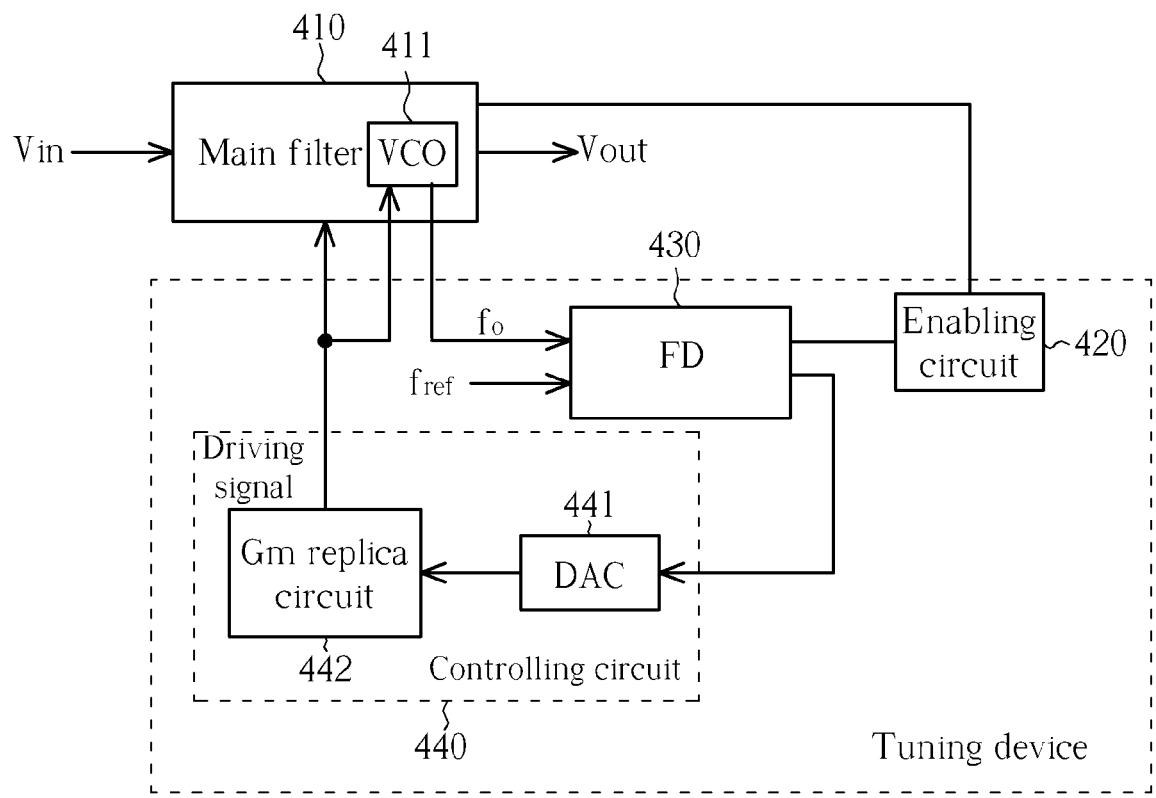
FIG. 4 is a diagram of a tuning apparatus of a first embodiment according to the present disclosure.

The entire implementation of the present disclosure is illustrated as follows. Please refer to FIG. 4, which is a diagram of a tuning apparatus 400 of a first embodiment according to the present disclosure. As shown in FIG. 4, the tuning apparatus 400 comprises an enabling circuit 420, a frequency detector (FD) 430, and a controlling circuit 440. The controlling circuit 440 comprises a digital-to-analog converter 441, and a Gm replica circuit 442. First, when the entire main filter 410 is in a tuning mode, a part of the main filter 410 is configured as the VCO structure 411 by the enabling circuit 420. The present disclosure does not limit the options for configuration. For example, a set of trans-conductor cells, which forms a two gm-C integrator structure, can be set active, and other trans-conductor cells are temporarily disabled such that the VCO structure 411 can be formed.

Figure 5:
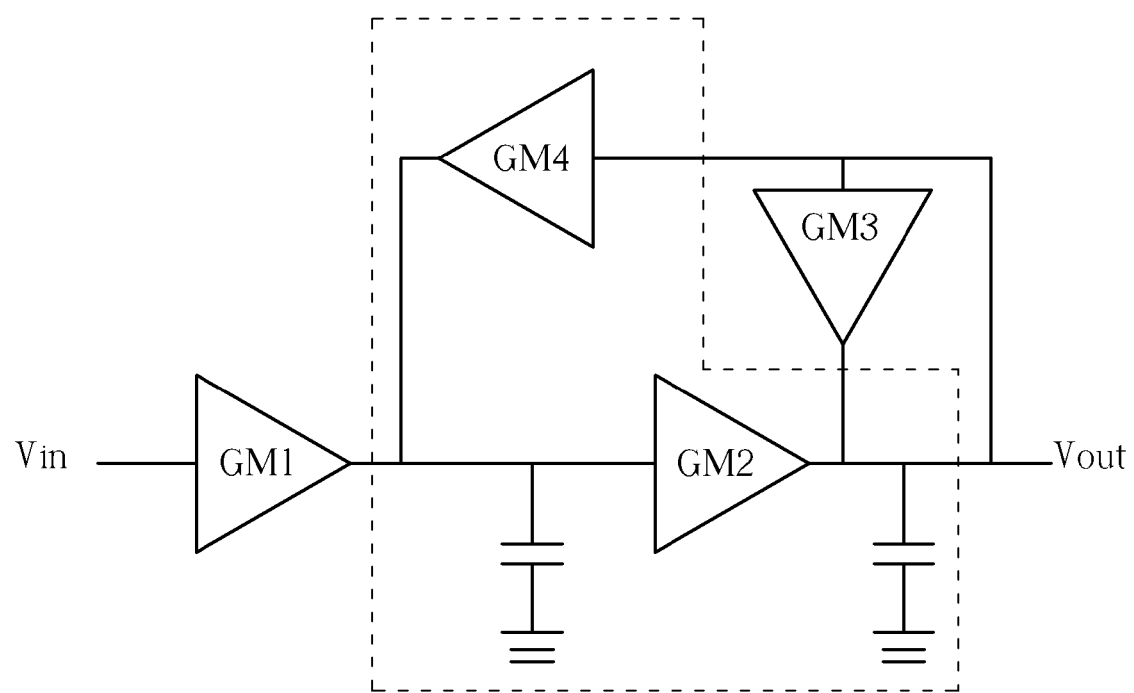
FIG. 5 shows a general two-level biquad filter.
Figure 6:
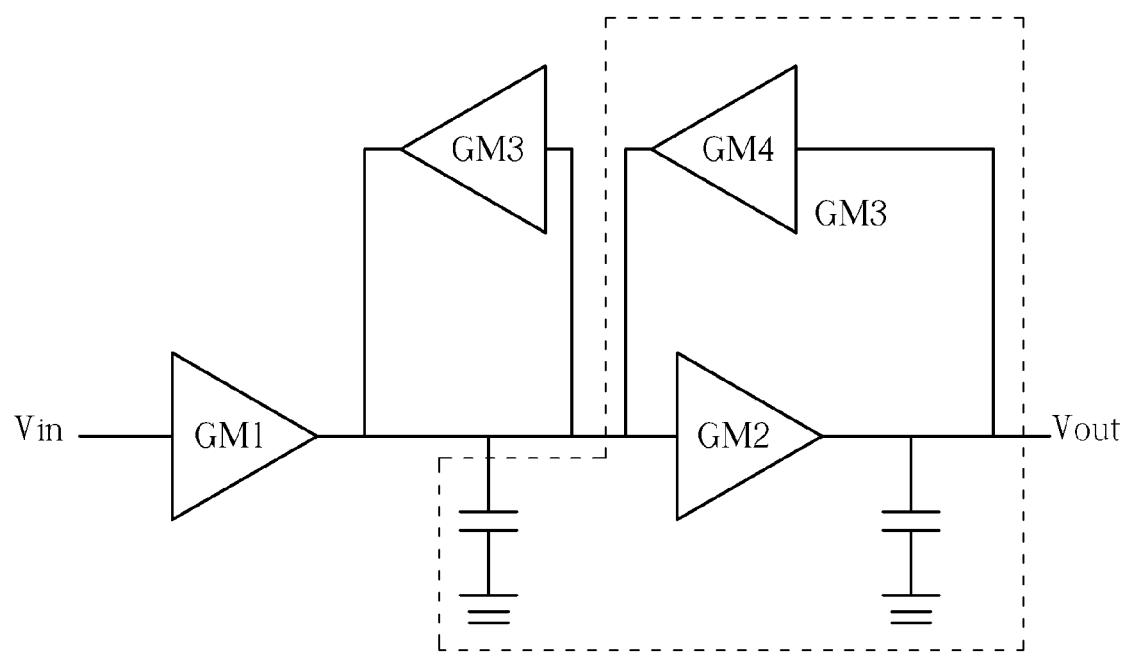
FIG. 6 shows a general two-level biquad filter.
Figure 7:
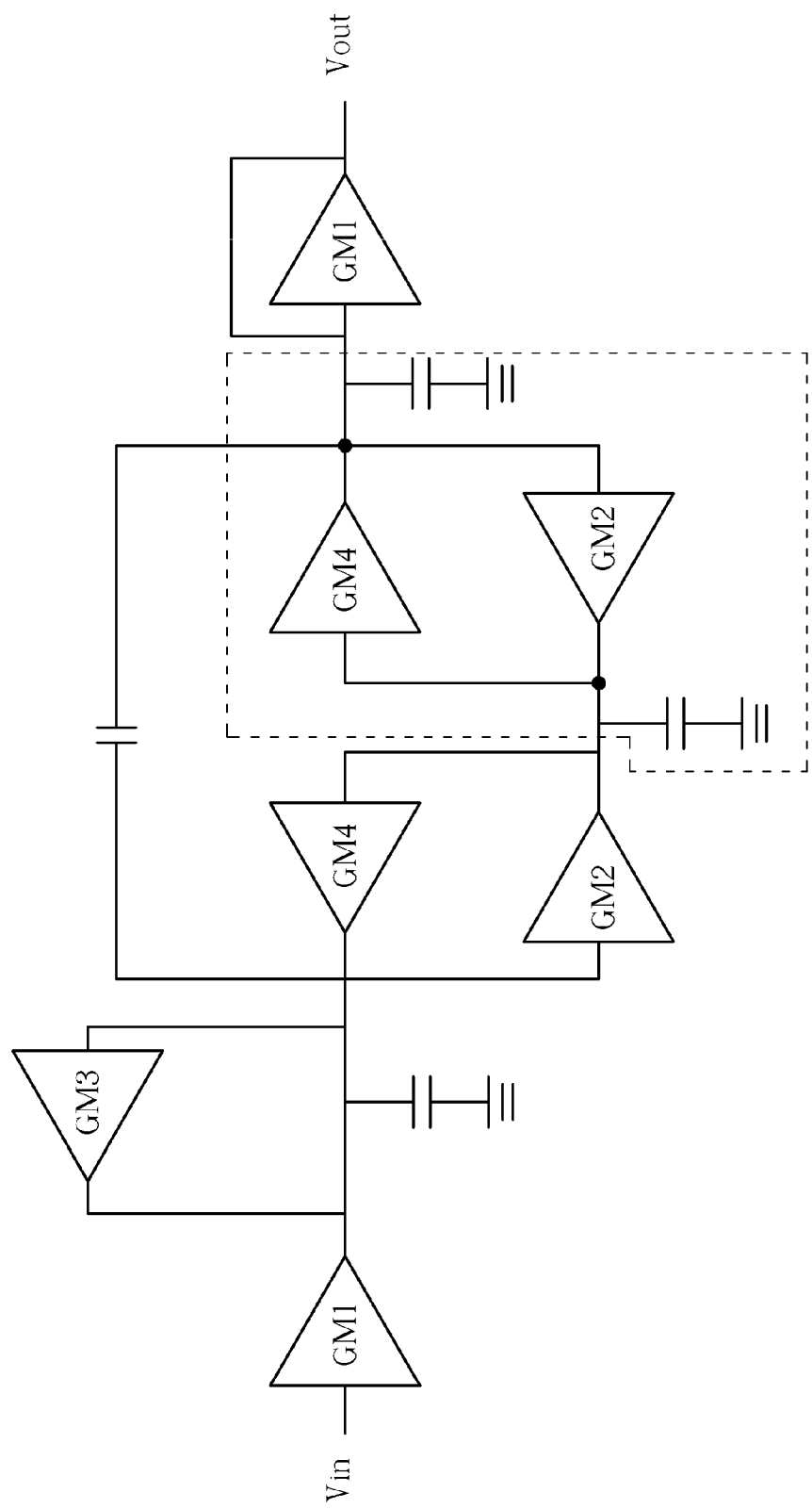
FIG. 7 shows an LC ladder filter.

A part of a filter can be configured as a VCO circuit. For example, a portion can be selected form a biquad filter or a LC ladder structure to serve as a VCO circuit. Other filter structure (not limited to biquad or LC ladder filter) can become a VCO circuit when a portion of the filter structure is enabled and other portion is disabled. Please refer to FIG. 5 and FIG. 6, which respectively show a general two-level biquad filter. Please also refer to FIG. 7. FIG. 7 shows an LC ladder filter. Basically, a simple VCO circuit can be formed by two gm cells and two capacitors, where a first capacitor is coupled to the input end of a first gm cell and the output end of a second gm cell, and a second capacitor is coupled to the input end of the second gm cell and the output end of the first gm cell. Therefore, as shown in FIG. 5, FIG. 6, and FIG. 7, the highlighted portion can be regarded as the above-mentioned VCO circuit 411. In addition, the gm-cells, which are utilized to form the VCO, are not limited to be the active gm-cells inside the filter. Because in a filter, some dummy gm-cells are often added at each node to compensate for the capacitor loading, the dummy gm-cells can also be utilized to form the VCO. This change also obeys the spirit of the present disclosure.

Figure 1:
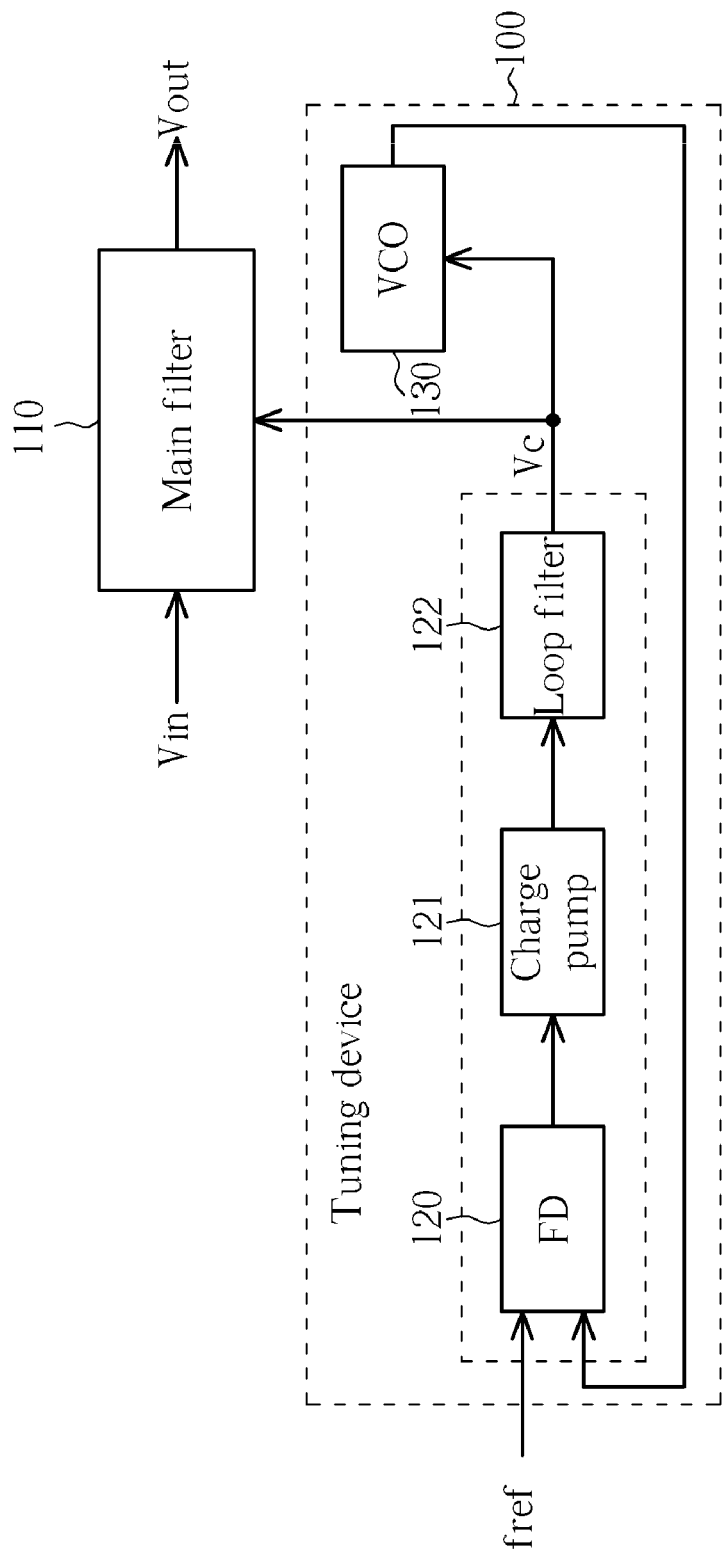
FIG. 1 is a diagram of a conventional tuning structure.
Figure 2:
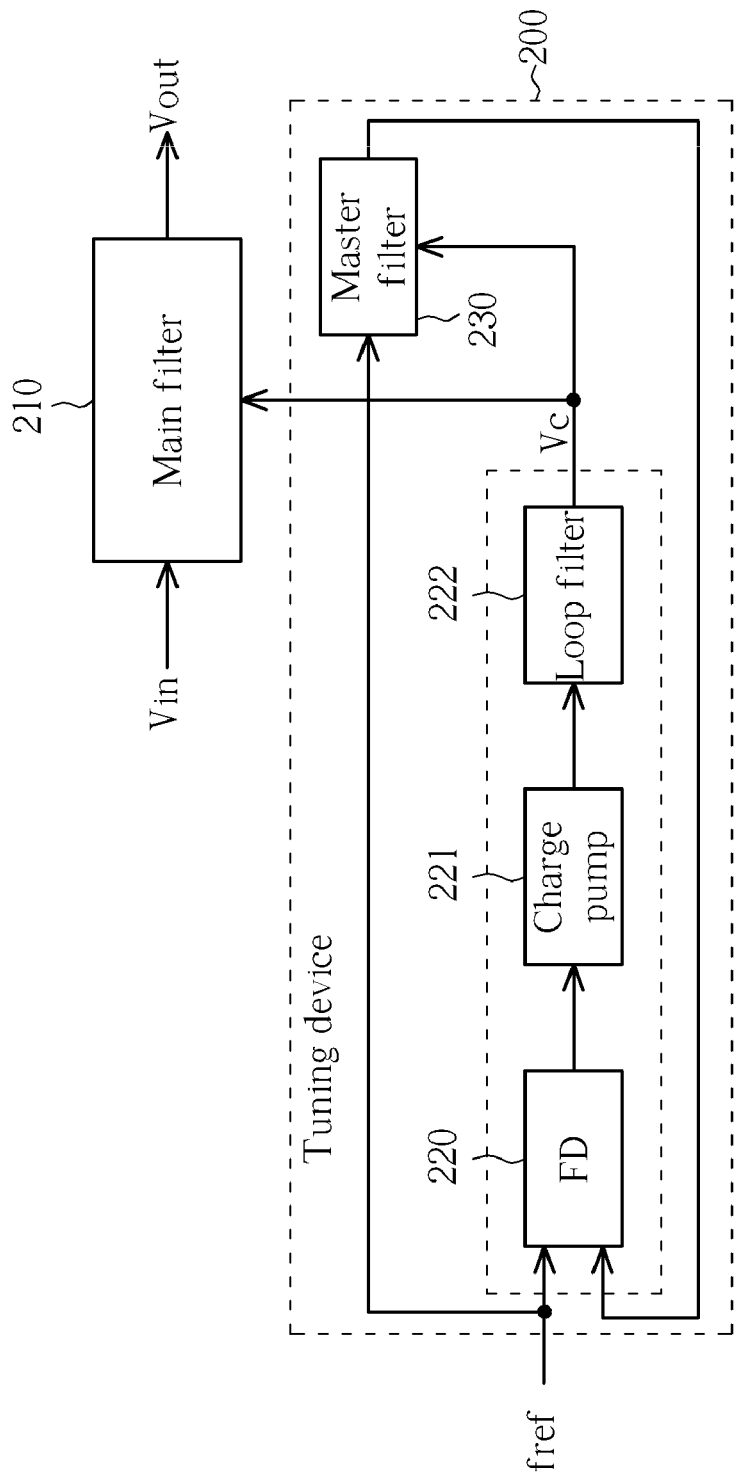
FIG. 2 is a diagram of another conventional tuning structure.
Figure 3:
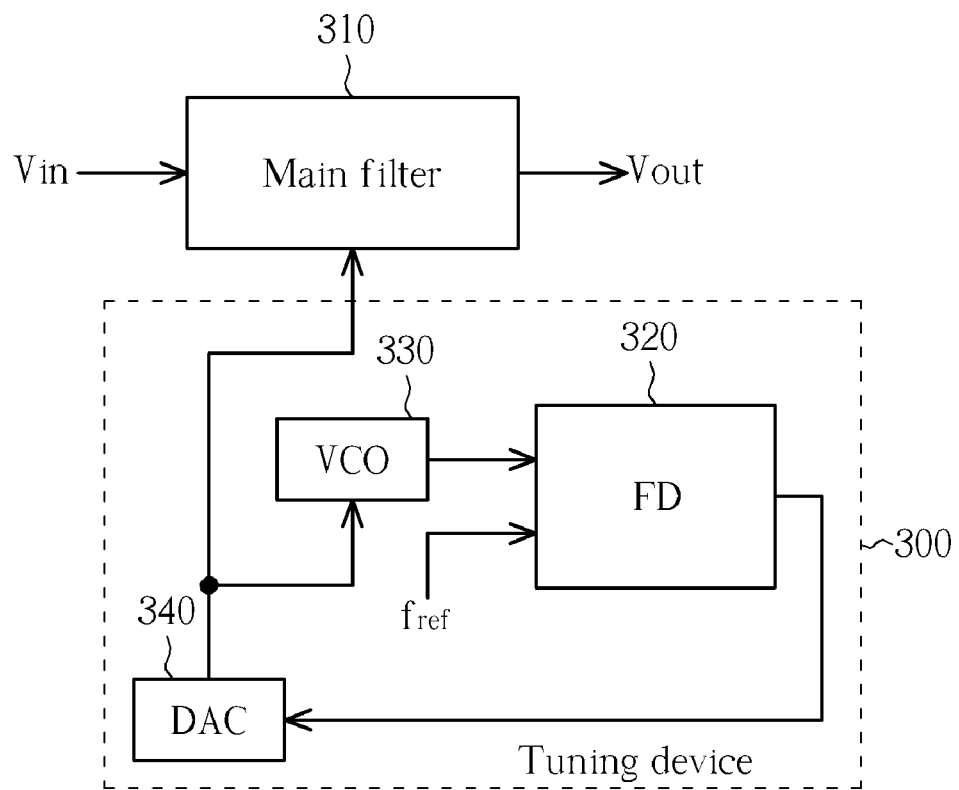
FIG. 3 is a diagram of another conventional tuning structure.

When the VCO structure 411 is formed, the VCO 411 starts to oscillate an oscillation signal having a frequency $w_o = N * g_{m,u}/C$ according to a driving signal. At this time, any of the above-mentioned three conventional mechanisms could be used to compare the frequency $f_o$ with the frequency $f_{ref}$. In this embodiment, similar to the digital circuit shown in FIG. 3, the digital frequency detector (FD) 430 compares the frequency the frequency $f_o$ with the frequency $f_{ref}$. The comparing result outputted from the FD 430 is then inputted into the controlling circuit 440 to generate the driving signal. The FD 430 becomes stable when the frequency $f_o$ and the frequency $f_{ref}$ are equal. Please note, because the VCO 411 is inside the main filter 410, when the VCO 411 is completely tuned, theoretically the main filter 410 is tuned.

Here, the controlling circuit 440 comprises a DAC 441 and a gm replica circuit 442. The DAC 441, as mentioned previously, is utilized to convert the comparing result into a driving signal. In the prior art, the driving signal can be utilized for the main filter 410, however, in the present disclosure, the gm replica circuit 442 is further utilized to adjust the driving signal such that the gm value of the gm cell in the main filter 440 is not influenced by temperature variation. Basically, the gm replica circuit 442 can maintain the gm value by adjusting the driving signal. The operation and function of the gm replica circuit 442 will be described in the following disclosure.

Therefore, when the VCO 411 is completely tuned, the main filter 410 is configured as the original circuit instead of the VCO 411. That is, when the frequency of the oscillation signal is equal to the reference frequency, the enabling circuit 420 switches the entire main filter 410 from the tuning mode to a normal mode. At this time, the main filter 410 can execute the original function and the main filter 410 is thereafter not utilized as a VCO.

Figure 8:
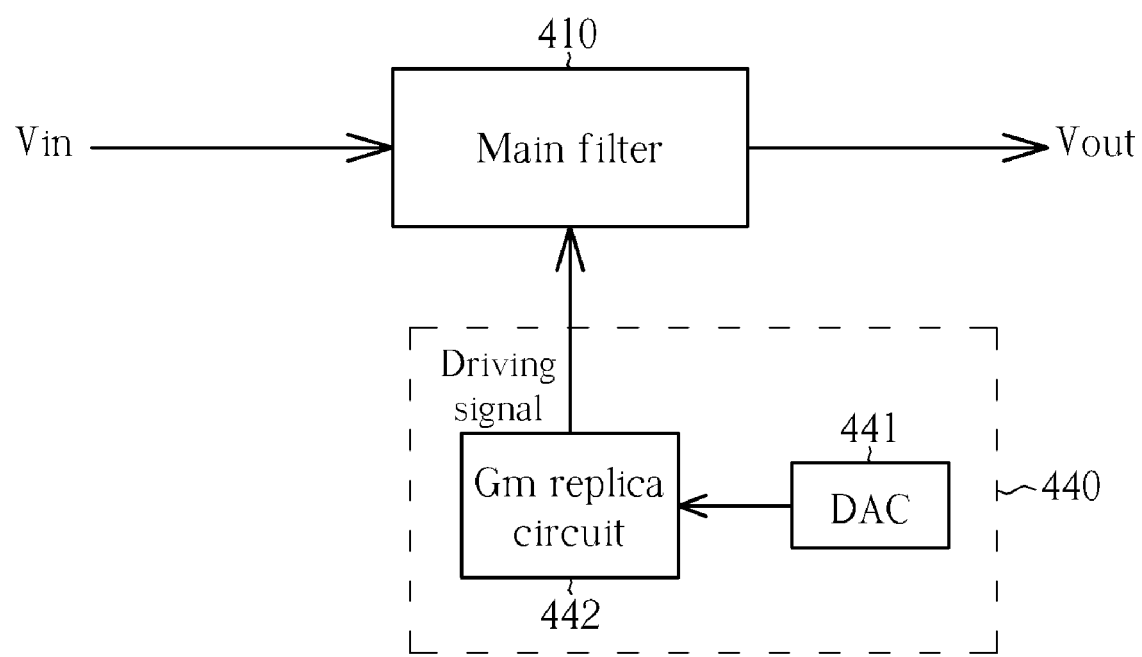
FIG. 8 is a diagram of the entire circuit when the main filter is in the normal mode.

Please refer to FIG. 8, which is a diagram of the entire circuit when the main filter 410 is in the normal mode. As shown in FIG. 8, since there is no VCO circuit in the normal mode, when the main filter 410 is in the normal mode the FD 430 has no input frequency source to compare with the reference frequency. In the normal mode, the DAC 441 outputs a constant analog signal (e.g., a current signal) to the gm replica circuit 442. The gm replica circuit 442 generates a driving signal to replicate a gm value to the gm cell in the main filter 410. The gm value is invariant when environment temperature varies. In other words, the tuned center frequency is temperature insensitive because of the gm replica circuit 442. The operation and structure of the gm replica circuit 442 will be discussed in the following disclosure.

Figure 9:
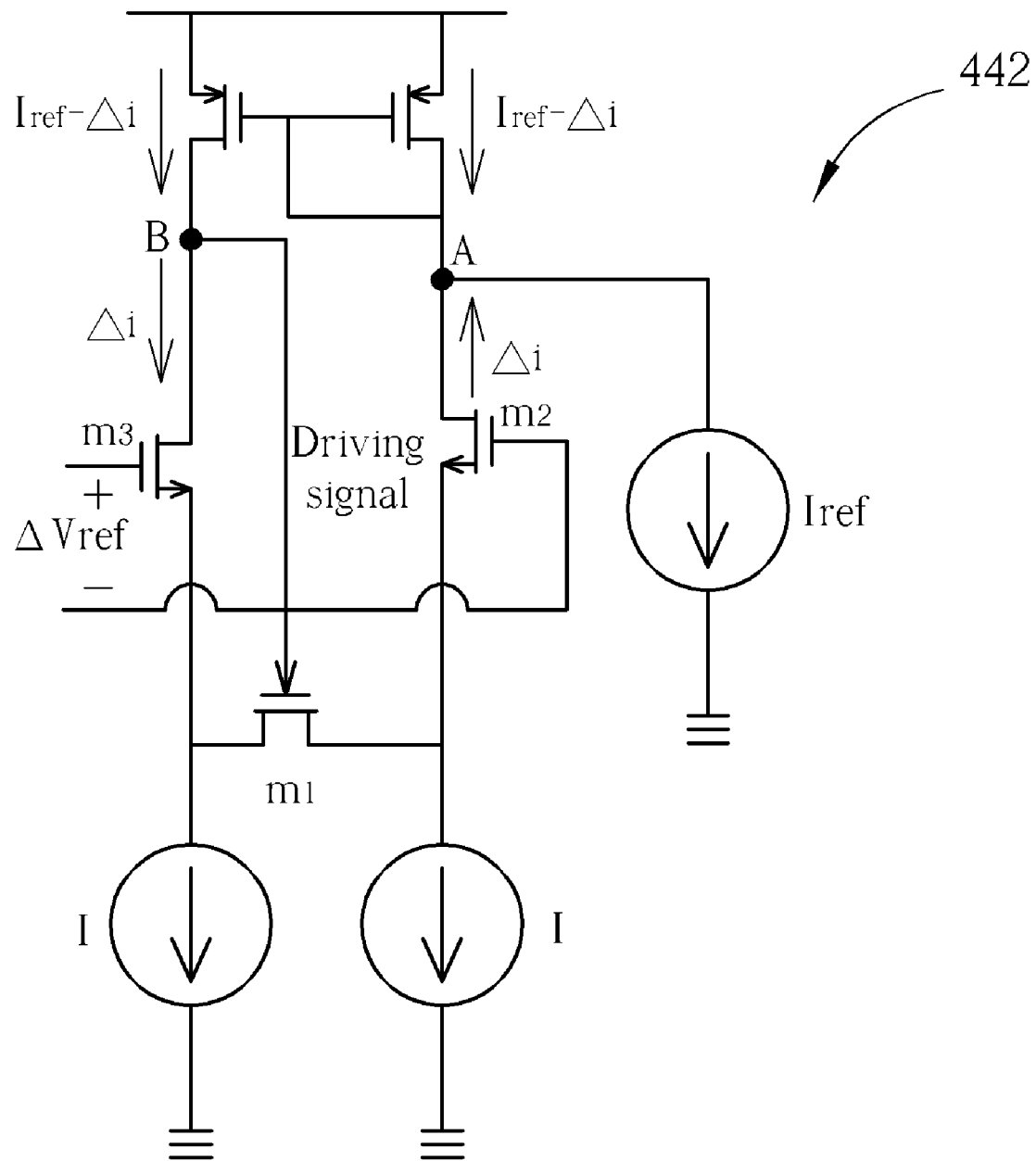
FIG. 9 is a diagram of the gm replica circuit shown in FIG. 4.

Please refer to FIG. 9, which is an exemplary detailed gm replica circuit. The gm replica circuit 442 comprises a current mirror, an NMOS m1, and a pair of input transistors m2 and m3. A reference voltage difference $\Delta V_{ref}$ is inputted to the gates of the input transistors m2 and m3. In addition, the node A and the node B are output nodes of the current mirror. The node A is further connected to the drain of the transistor m2 and a reference current $I_{ref}$. Please note, in this embodiment, the reference current $I_{ref}$ is outputted from the DAC 441. The node B is directly connected to the gate of the NMOS m1 and connected to the drain of the transistor m3. Therefore, the driving signal of the node B can be utilized to adjust the resistance of the NMOS m1 such that the gm value of the entire gm replica circuit 442 is tuned back to a desired value.

The basic concept of the gm replica circuit 442 is to utilize the inner negative feedback loop to fix the gm value of the gm replica circuit 442 as gm=$I_{ref}/\Delta V_{ref}$, where $I_{ref}$ is a temperature-insensitive reference current, and $\Delta V_{ref}$ is a temperature-insensitive reference voltage, which can be generated from a bandgap voltage generator.

The following is offered as proof. When the voltage difference $\Delta V_{ref}$ is applied to the gates of the transistor m3 and m2, an additional current $\Delta i$ is induced to flow through the transistor m3. An additional current $\Delta i$ also appears and flows through the transistor m2 toward the node A. Therefore, the current flowing from the current mirror to the node A would be ($I_{ref}-\Delta i$), where ($I_{ref}-\Delta i$) would be equal to $\Delta i$ because of the current mirror. Therefore, $I_{ref}$ is equal to 2*$\Delta i$. Since gm=2*$\Delta i/\Delta V_{ref}=I_{ref}/\Delta V_{ref}$, the resulting gm is $I_{ref}/\Delta V_{ref}$, which is invariant when temperature varies. In other words, if the Iref and the Vref are both temperature-independent, the Gm value of the gm replica circuit is stable and the control voltage used to control the Gm value can also be utilized in the main filter. The reference voltage Vref can be generated from a bandgap circuit to ensure that the reference voltage $\Delta V_{ref}$ is not influenced by temperature variances. The reference current Iref is received from the DAC.

Moreover, the entire circuit (i.e., the negative feedback) can automatically adjust the voltage $V_c$ to make the gm value always remain fixed at $I_{ref}/\Delta V_{ref}$. For example, if the ambient temperature increases, the gm value increases accordingly. The current $\Delta i$ increase because 2*$\Delta i$=Gm*$\Delta V_{ref}$. Therefore, for the current mirror, the current ($I_{ref}-\Delta i$) flowing toward the node A decreases because of the increase of the current $\Delta i$. And in the node B, the current above the node B is equal to ($I_{ref}-\Delta i$), but the current below the node B is equal to $\Delta i$. Therefore, the driving voltage of the node B is pulled down by the current $\Delta i$. In other words, the gate voltage of the NMOS m1 decreases such that the gm value decreases. Obviously, the entire circuit is a negative feedback mechanism such that the gm value of the entire gm replica circuit is fixed.

Therefore, as long as the gm cell of the gm replica circuit 442 is equal to the gm cell of the main filter 410, the gm value of the main filter 410 can be maintained as that of the gm replica circuit 442 because they share the same driving voltage.

In addition, the gm replica circuit 442 is an optional device, and it is not a limitation of the present disclosure. For example, the implementation of the gm replica circuit is not limited. For example, if the filter can further comprise a negative feedback loop according to its gm cell, the same effect can be achieved. On the other hand, if the entire filter tuning structure includes the gm replica circuit, the output of the DAC can be directly utilized to change the $I_{ref}$ or $\Delta V_{ref}$ in order to further adjust the gm value such that the oscillation frequency of the VCO can be equal to the target value.

Figure 10:
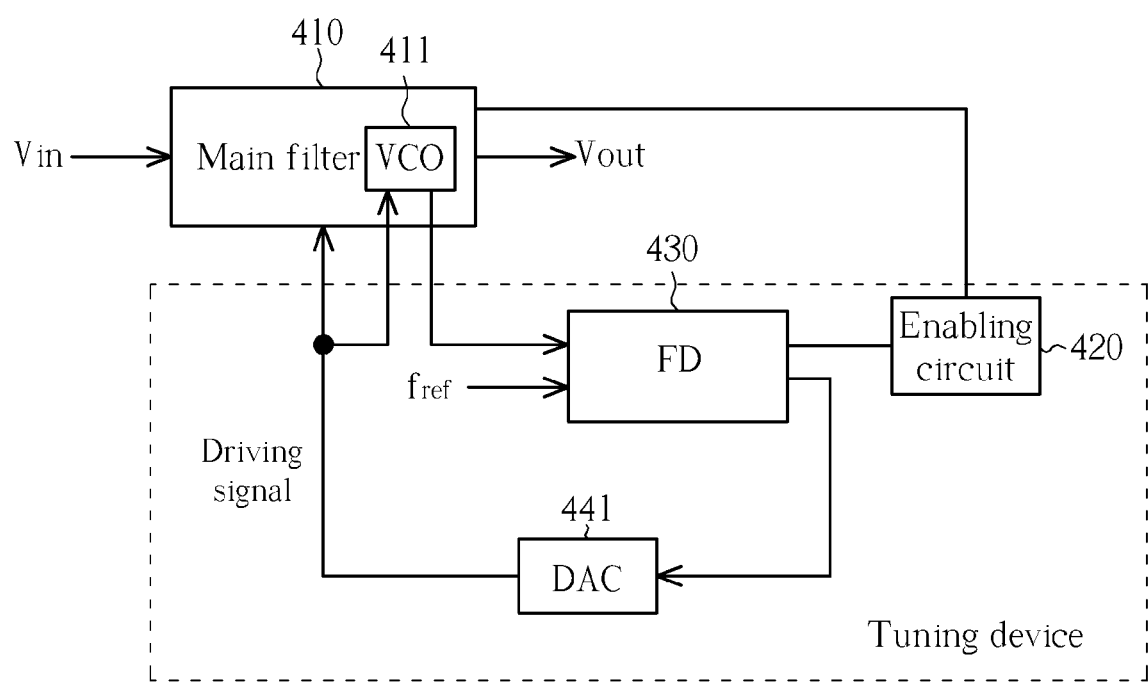
FIG. 10 is a diagram of a tuning device of a second embodiment according to the present disclosure.

Moreover, in some applications, if the temperature variation is insignificant, or the gm cell is insensitive to the temperature variation, the tuning device 400 requires only the DAC 441. This means that the gm replica circuit 442 is no longer needed. Please refer to FIG. 10, which is a diagram of a tuning device 1000 of a second embodiment according to the present disclosure. As shown in FIG. 10, the tuning device 1000 does not comprise a gm replica circuit. This also obeys the spirit of the present disclosure.

In addition, in the above disclosure, a digital FD and a DAC are used for comparing the oscillation frequency and a reference frequency. Please note, the above-mentioned mechanism is only an embodiment, not a limitation of the present disclosure. For example, the present disclosure can also utilize a PLL including an FD, charge pump, and a low pass filter. That is, the FD is utilized to compare the frequencies, and the charge pump and the low pass filter can convert the comparison result of the FD into a driving signal for the main filter. This can also achieve the goal of tuning the center frequency of the main filter.

Please note, in the above disclosure, only the gm value is tuned. But in the actual implementation, either the gm value or the capacitance can be tuned to change the center frequency of the main filter. This change also obeys the spirit of the present disclosure.

In contrast to the prior art, the present disclosure can utilize the components of the filter to build a VCO and use the VCO to tune the filter. Therefore, the present disclosure does not need another VCO to perform the tuning operation. This saves the cost and the area that is otherwise required by the VCO. Furthermore, because the present disclosure directly utilizes the VCO circuit inside the filter, the environment of the VCO and the filter are guaranteed to be identical. Therefore, the mismatch problem between the VCO and the filter, which may introduce poor tuning performance, is no longer a concerned. In other words, the present disclosure has improved tuning performance. Those skilled in the art will readily observe that numerous modifications and alterations of the device and method may be made while retaining the teachings of the invention. Accordingly, the above disclosure should be construed as limited only by the metes and bounds of the appended

What is claimed is:

1. A method for tuning a filter, the method comprising:
   enabling a VCO circuit, wherein at least a portion of the VCO circuit is selected from the filter;

generating an oscillation signal by the VCO circuit according to a driving signal;
comparing the oscillation signal with a reference signal and generating a comparison result; and
adjusting the driving signal according to the comparison result.

2. The method of claim 1, wherein the filter is a transconductor-capacitor (Gm-C) filter comprising a plurality of capacitors and gm cells.

3. The method of claim 2, wherein the driving signal is capable of changing either transconductance of the gm cells or capacitance of the capacitors.

4. The method of claim 2, wherein the comparing step is performed by a digital frequency detector and the adjusting step is performed by a digital-to-analog converter.

5. A filter, comprising:
a first portion;
a second portion; and
an enabling circuit to incorporate the second portion into a VCO circuit in a tuning mode;
wherein the first portion and the second portion perform a filtering operation in a normal mode.

6. The filter of claim 5, wherein the first portion comprises a plurality of gm cells and the second portion comprises a plurality of gm cells and capacitors.

7. The filter of claim 5, further wherein the VCO circuit generates an oscillation signal according to a driving signal in the tuning mode.

8. A tuning apparatus for tuning a filter, comprising:
an enabling circuit for switching the filter between a normal mode and a tuning mode, wherein in the tuning mode, a portion of the filter is configured to be a VCO for generating an oscillation signal according to a driving signal, and in the normal mode, the filter performs a filtering operation;
a frequency detector for comparing the oscillation signal with a reference signal and generating a comparison result; and
a controlling circuit for adjusting the driving signal according to the comparison result.

9. The tuning apparatus of claim 8, wherein the filter is a transconductor-capacitor (Gm-C) filter comprising a plurality of capacitors and gm cells.

10. The tuning apparatus of claim 9, wherein the driving signal is capable of changing either transconductance of the gm cells or capacitance of the capacitors.

11. The tuning apparatus of claim 9, wherein the VCO comprises:
a first gm cell having a first input end and a first output end;
a second gm cell having a second input end and a second output end;
a first capacitor, electrically connected to the first input end and the second output end; and
a second capacitor, electrically connected to the second input end and the first output end.

12. The tuning apparatus of claim 11, wherein the driving signal is capable of changing either transconductance of the first and the second gm cells or capacitance of the first and the second capacitors.

13. The tuning apparatus of claim 8, wherein the frequency detector is a digital frequency detector, and the controlling circuit comprises a digital-to-analog converter (DAC) for converting the comparison result into the driving signal.

14. The tuning apparatus of claim 13, wherein the controlling circuit further comprises a gm replica circuit, coupled to the DAC, for adjusting the driving signal in the normal mode according to ambient temperature variation.

* * * * *